United States Patent [19]

Asars et al.

[11] Patent Number: 4,950,957
[45] Date of Patent: Aug. 21, 1990

[54] EXTENDED ION SOURCES AND METHOD FOR USING THEM IN AN INSULATION DEFECT DETECTOR

[75] Inventors: Juris A. Asars, Murrysville Boro; Peter J. Chantry, Pittsburgh, both of Pa.

[73] Assignee: Westinghouse Electric Corp., Pittsburgh, Pa.

[21] Appl. No.: 267,150

[22] Filed: Nov. 4, 1988

[51] Int. Cl.$^5$ .............................................. H01J 27/02
[52] U.S. Cl. ........................... 315/111.81; 250/423 R; 324/539; 324/541; 324/543; 324/544
[58] Field of Search ............... 315/111.81; 250/423 R, 250/423 A, 424; 324/539, 541, 543, 544

[56] References Cited

U.S. PATENT DOCUMENTS

| | | |
|---|---|---|
| 2,044,424 | 6/1936 | Edwards et al. |
| 3,096,478 | 7/1963 | Brown. |
| 3,131,347 | 4/1964 | Brooks et al. |
| 3,263,165 | 7/1966 | Eigen. |
| 3,421,076 | 1/1969 | Eigen. |
| 3,440,528 | 4/1969 | Anderson. |
| 3,515,986 | 6/1970 | Peschel. |
| 3,612,994 | 10/1971 | Hooper ................................ 324/54 |
| 3,639,831 | 2/1972 | Cushman ............................. 324/33 |
| 3,968,426 | 7/1976 | Ward, Jr. et al. ................... 324/54 |
| 3,990,003 | 11/1976 | Agee, Jr. et al. ................... 324/52 |
| 4,296,372 | 10/1981 | Feuerbaum ..................... 324/71 EB |
| 4,422,034 | 12/1983 | Matsuno et al. .................... 324/51 |
| 4,862,032 | 8/1989 | Kaufman et al. ......... 315/111.81 X |

FOREIGN PATENT DOCUMENTS 0447650 10/1974 U.S.S.R. ................................. 324/543

Primary Examiner—Eugene R. Laroche
Assistant Examiner—Do Hyun Yoo
Attorney, Agent, or Firm—E. F. Possessky

[57] ABSTRACT

A method of detecting insulation defects in a wire using an extended ion source wherein ions are generated along the entire length of the extended ion source and flow toward an insulated cable located in close proximity thereto. If there are defects in the cable insulation, a real current will flow through the insulation defects and into the cable conductor. The presence of this real current can be measured by connecting one end of the cable conductor to an ammeter and changes in this current indicate the existence of a defect in the wire insulation. In another embodiment of the extended ion source, the ions are generated only in a small portion of the extended source at any one time. By exciting the source with the proper sequence of signals, the ion generation scans or propagates along the entire length of the extended ion source.

13 Claims, 2 Drawing Sheets

EXTENDED ION SOURCES AND METHOD FOR USING THEM IN AN INSULATION DEFECT DETECTOR

This invention was conceived in part under U.S. Air Force Contract No. F30602-86-C-0264. The U.S. Government has rights in the invention.

FIELD OF THE INVENTION

The present invention relates to methods and devices used to detect defects in the insulation surrounding wires and cables. More particularly, the present invention relates to ion sources and methods for using them in an insulation defect detector.

BACKGROUND OF THE INVENTION

In certain situations and circumstances it is important to know if the insulation surrounding a wire or cable has deteriorated. Such deterioration could be a precursor to a failure in an important system. For example, in jet fighter aircraft, wire chaffing and the resulting deterioration of the insulation are often precursors to failure. If the chaffing continues undetected, the cable may be severed or shorted to another cable with catastrophic results depending on the purpose of the cable. If the cable is used to control the rudder or aileron, severing or shorting that cable could result in a loss of control of the aircraft and possibly a fatal crash. It would be desirable therefore to have a method and device for detecting the deterioration and failure of wire insulation. If insulation defects and deterioration are detected in a timely manner, the wire or cable could be replaced before a catastrophic failure occurs.

U.S. Pat. No. 3,096,478 discloses an apparatus for detecting non-uniformity in electrically insulated wires through the use of conductive gas electrodes. The electrodes consists of a tube or sleeve containing ionized air which establishes a direct current path through the defective insulation segment. In the apparatus disclosed in this patent, the cable must be placed inside the conductive gas electrode. Similarly, the cable must be placed inside the nonconducting tube containing a semiconducting ionized gas to test the insulation in the apparatus described in U.S. Pat. No. 3,263,165. Placing the cable in a tube presents a problem when testing many installed cables which because of their location are relatively inaccessible and cannot easily be inserted in a tube.

U.S. Pat. No. 3,639,831 discloses a method and apparatus for producing a directable, electrically conducting gas jet and detecting the presence of anomalies therein caused by insulators, conductors or semi-conductors. This method requires that the object causing the anomaly be placed between the gas jet and the measuring electrode. This again requires that the item causing the anomaly be reasonably accessible.

It would be desirable therefore to have an insulation defect detector which was capable of being used in relatively inaccessible locations and which could easily locate and pinpoint defects in wire insulation.

SUMMARY OF THE INVENTION

Generally, the present invention relates to extended ion sources used in an insulation defect detector. In one embodiment, the ion source simultaneously produces ions along its entire length by either field induced ionization or by thermally induced ionization. In another embodiment, the field induced ionization is scanned along the ion source so that the ion production propagates along the ion source with only a small portion of the ion source generating ions at any given time. This digitally stepped or scanned ion source can be used in many other situations or devices in addition to an insulation defect detector.

The extended ion source generally comprises an extended ion generating electrode and at least one extended field electrode spaced apart therefrom. By electrically or thermally exciting the ion generating electrode, ions are generated which travel toward the field electrode. Not all of the ions are captured by the field electrode, however, and those ions that escape are used to locate defects in the insulation of a wire or cable. Preferably, the extended ion generating electrode and the extended field electrode are maintained in a spaced apart relationship along their entire length by a plurality of insulated spacers. Preferably, a plurality of extended field electrodes are used to form the extended ion source.

One advantage of the extended ion source of the present invention is that it can easily be located next to a test cable, even if the cable is in a relatively inaccessible location. For example, it can be snaked and maneuvered into the proper location next to an installed cable. Alternatively, it can be placed in a bundle of new cables which will later be tested either before or after they are installed. When the extended ion source is placed in close proximity to a cable to test its insulation, and is electrically or thermally excited, some of the ions flow to the surface of the cable's insulation and form a capacitive charge thereon. If there is a defect in the insulation, the charge will actually flow to the cable's conductor located within the insulation. By disconnecting one end of the cable and measuring the real current due to the ion source that is flowing in the conductor with an ammeter, one can determine if there are any defects in the insulation. By using several extended ion sources or by moving one ion source along the length of the cable, one can determine which portions of the cable contain defects in the insulation.

Alternatively, by scanning a multi-phase extended ion source, one can detect and pinpoint the defects in the cable's insulation without moving the ion source or using several ion sources. A scanned extended ion source generally comprises an extended ion generating electrode, a plurality of extended ionizing burst conductors and a plurality of capacitive couplings in series with ion gaps each combination being located between an extended ionizing burst conductor and the ion generating electrode to form a linear array along the length of the ion source. Each ionizing burst conductor is activated in turn by a series of electrical pulses such that the ion generation propagates down the length of the extended ion source.

The scanned extended ion source is an open structure with a number of discrete ionizing gaps arranged in a linear array so that each gap is exposed to the ions generated by its nearest neighbors. Each gap is electrically in series with a coupling capacitor and the series combination is connected between the ion generating electrode and one of the ionizing burst conductors which provides a series of a.c. ionizing bursts having a peak potential amplitude sufficient to maintain but not initiate ionization in the gaps. These gaps are divided in groups of one or more where all gaps in a group are connected to the same ionizing burst conductor and physically adjacent groups are connected to different ionizing burst conductors. For a group of gaps to be ionized, it must be supplied with an ionizing burst while at least one of its adjacent neighbor groups in the linear array is in the ionized state. If a group in the extended source is initially ionized and the proper sequence of electrical pulses is placed on the ionizing burst conductors, the physical location of the ionized group can be stepped along the entire length of the ion source.

Other details, objects and advantages of the present invention will become more readily apparent from the following description of a presently preferred embodiment thereof.

DESCRIPTION OF THE DRAWINGS

In the accompanying drawings, a preferred embodiment of the present invention is illustrated, by way of example only, wherein.

DESCRIPTION OF THE PREFERRED EMBODIMENT

In order to detect insulation defects in wires or cables which are enclosed in ducts or in other not easily accessible locations, without removing them, an extended source of ionized gas could either be incorporated into the cable assembly prior to installation or it could be placed in close proximity to the cable before a test. During the test of the insulation of the cable, the extended ion source is activated along its entire length and the real current component between it and the cable under test is used to determine the condition of the insulation surrounding the conductor.

Figure 1:
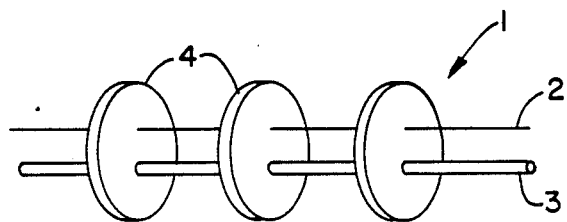
FIG. 1 shows an extended ion source.
Figure 2:
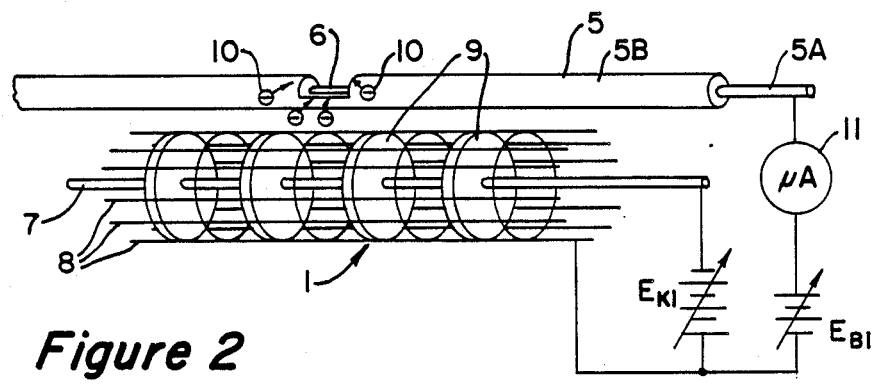
FIG. 2 shows another embodiment of an extended ion source used in an insulation defect detector.

One possible embodiment of the extended ion source 1 is illustrated in FIG. 1 which shows an extended ionizing electrode 2 and an extended field electrode 3 held in a spaced apart relationship by a plurality of insulating spacers 4. Another embodiment of the extended ion source is shown in FIG. 2. A corona or high electric field discharge is generated in an extended ion source 1 in the shape of a coaxial cable placed along side the insulated cable 5 or cables to be tested. Preferably the distance between the ion source 1 and the cable under test is less than 2 inches. The corona discharge is generated and maintained by a variable voltage source $E_{K1}$ having a d.c. or an a.c. potential of the appropriate magnitude and polarity.

Preferably the coaxial cable ion source consists of a small diameter ionizing electrode 7 (cathode) centered inside a grid of field electrodes 8 (anode) and held in place by a plurality of ceramic insulating disks 9. As this entire structure is open to the ambient air or gas, some of the ionized gas molecules 10 accelerated toward the grid of field electrodes 8 will escape from the ion source 1 and provide a real current component to the conductor 5A of cable 5 being tested for defective insulation.

By connecting one end of cable 5 to a microammeter 11, one can detect the presence of the real current in conductor 5A which indicates the existence of a defect 6 in insulation 5B. Preferably a bias voltage $E_{B1}$ is placed between the field electrodes 8 and the cable 5 under test to improve the sensitivity of this test. It enables the current swings detected in the current measuring instrument 11 to be centered around zero. The bias voltage $E_{B1}$ must be within the safety limits for the particular cable assembly being tested.

Figure 3:
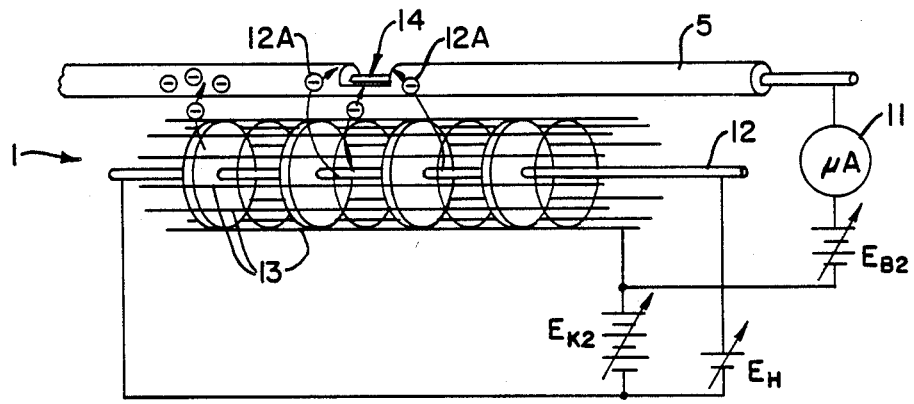
FIG. 3 shows an embodiment of an ion source using thermally induced ionization in an insulation defect detector.

Another embodiment of the extended ion source which utilizes thermally induced ionization is shown in FIG. 3. It has an ionizing electrode 12 which is heated by an energy source $E_H$. The ionizing electrode 12 emits electrons which attach themselves to gas molecules to form ions 12A which are accelerated toward a grid of field electrodes 13 held at a positive voltage $E_{K2}$ with respect to the ionizing electrode 12. As in the previous embodiment, some of the ionized gas molecules escape through the grid and form a real current component to the cable 5 under test if it has a defect 14 in its insulation. Again, the measurement of the real current component is enhanced by the presence of a bias potential $E_{B2}$ which enables the changes in the real current to be centered on zero.

Various known materials can be used as the thermionic electron emitter or ionizing electrode 12. It has been found that an alkali metal carbonate coated on ionizing electrode 12 when heated to approximately 800° C. at atmospheric pressure can generate approximately 10 microamperes of current per square centimeter of electrode area. The field voltage $E_{K2}$ can be either a.c. or d.c. By varying the field voltage $E_{K2}$, one is able to modulate the ion generation. The heat source $E_H$ does not need to be activated at all times. For example, pulse heating of the ionizing electrode 12 can be used to prevent excessive temperature rise in the cable 5 under test conditions. This is especially true if a low duty cycle heating pulse is used.

Preferably, an extended ion source having several separate segments is placed along the length of a cable under test and is also used to provide information on the location of any insulation defects. If the segments of the extended ion source are not too long, other ways of ion generation such as photoelectric electron sources or R.F. electric field excitation can also be used.

For the method of insulation defect detection described above, the entire length or segment of an extended ion source is active during the test procedure resulting in considerable power dissipation. In addition, for long cables the resulting low signal to background ratio for small insulation defects can sometimes prevent their detection. These limitations are minimized or eliminated when only a very small section of the extended ion source is activated at any one time. This can be accomplished by using a multi-phase scanned extended ion source using capacitively coupled electric field ionization.

Figure 4:
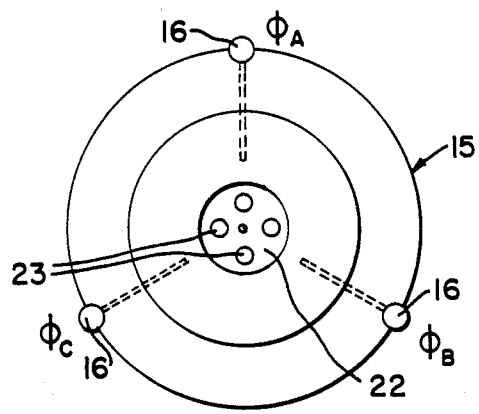
FIG. 4 shows an end view of a scanned extended ion source.
Figure 5:
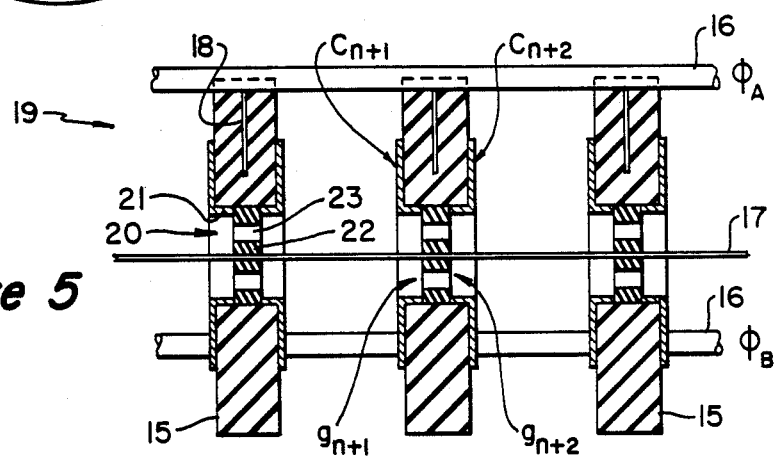
FIG. 5 shows a side view of the scanned extended ion source shown in FIG. 4.

A coaxial embodiment of a scanned extended ion source is illustrated in FIGS. 4 and 5. A plurality of dual ceramic disc capacitors 15 are connected to and also serve as spacers for the ionizing burst conductors 16 ( $\phi_A$, $\phi_B$, $\phi_C$) that supply the ionizing bursts to the ionizing electrode 17. The common terminal 18 of each dual capacitor in the linear array 19 is connected to only one of the ionizing burst conductors 16. Preferably, the angular position of the capacitors determine to which ionizing conductor 16 each capacitor 15 and its associated ion gap 20 belongs. The ionization gaps 20 are formed between the extremely small diameter ionizing electrode 17 and the inner edge 21 of the exposed capacitor terminals. An insulating spacer 22 with a plurality of apertures 23 therein provide an unobstructed space wherein electric field ionization can occur as well as for ion passage from one gap to another. The insulating spacers 22 keep the ionizing electrode 17 in the proper location compared to the linear array 19 of capacitors 15.

Figure 6:
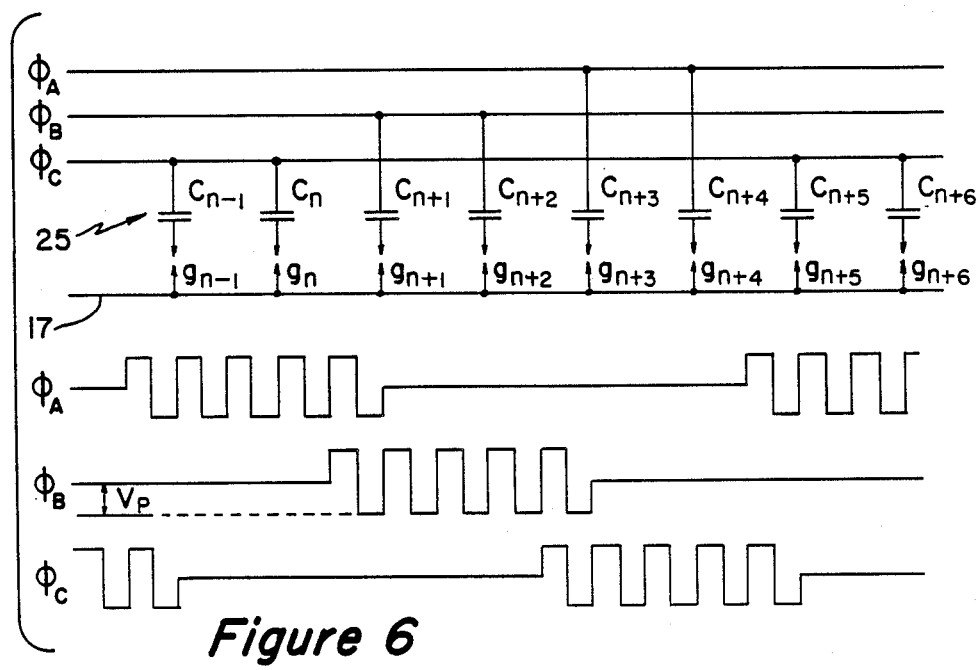
FIG. 6 shows a circuit diagram of and a set of activation signals for the scanned extended ion source of the present invention.

A scanned extended ion source 25 is schematically illustrated in FIG. 6 together with representative ionizing burst potential waveforms 26. In this example, there are three ionizing burst conductors $\phi_A$, $\phi_B$, $\phi_C$, all coupled to the same ionizing electrode 17 by a plurality of group connections each containing two gaps with their associated capacitors. Gaps $g_{n-1}$ and $g_n$ are first ionized by some means such as an adjacent trigger gap in the presence of electrical pulses such as ionizing burst $V_p$ between ionizing burst conductor $\phi_A$ and ionizing electrode 17. As an ionizing burst is applied to ionizing burst conductor $\phi_B$, capacitor $C_{n+1}$ is partially charged and discharged through gap $g_{n+1}$ due to the close proximity of ionized gap $g_n$. As the degree of ionization in gap $g_{n+1}$ increases the potentials on capacitor $C_{n+1}$ approach $V_p$ and $-V_p$ with respect to ionizing electrode 17. As a result, the maximum magnitude of instantaneous potential across gap $g_{n+1}$ tends toward $2 V_p$. As soon as a sufficient number of ions are produced by gap $g_{n+1}$, the other gap $g_{n+2}$ in the group becomes ionized. When the ionization burst on ionizing conductor $\phi_A$ terminates, the potential across gaps $g_{n-1}$ and $g_n$ decays toward zero in the presence of residual ionization. Next, the ionizing burst is applied to ionizing burst conductor $\phi_C$ which ionizes gaps $g_{n+3}$ and $g_{n+4}$ due to proximity of ionized gap $g_{n+2}$. An ionizing burst applied to ionizing burst conductor $\phi_A$ completes one sequence as it ionizes gaps $g_{n+5}$ and $g_{n+6}$ due to the proximity of ionized gap $g_{n+4}$. Gaps $g_{n-1}$ and $g_n$ are not ionized during the burst on ionizing burst conductor $\phi_A$ because of the absence of any adjacent ionized neighbors. This is achieved by adjusting the overall period of the signal on ionizing burst conductor $\phi_A$ so that the level of ionization in the area around gaps $g_n$ and $g_{n-1}$ has fallen below the level necessary for the gaps to fire. The direction of propagation along the linear array 19 for the ionization depends on the phase sequence of the electrical pulses.

Preferably the electrical pulses used to activate ionizing burst conductors 16 are square waves with a magnitude $V_p$ just below the ionizing voltages of the gaps 20. While the electrical pulses shown in FIG. 6 overlap, i.e. the signal on conductor $\phi_B$ beginning before the signal on $\phi_A$ is finished, this is not necessary. The signals could be timed to begin and end at the same time or one could end before the other began as long as sufficient ions remained in the gap to maintain the propagation of the ionization along the linear array.

While the embodiment shown used three ionizing burst conductors, it is evident that four or more conductors will also work. Even two conductors can be made to work although the timing of the electrical pulses becomes more difficult in order to maintain propagation in the proper direction.

While a presently preferred embodiment of practicing the invention has been shown and described with particularity in connection with the accompanying drawings, the invention may otherwise be embodied within the scope of the following claims.

What is claimed:

1. A method for detecting defects in an insulation covered wire comprising the steps of:
   (a) placing an extended ion source in close proximity to the insulation covered wire, the ion source comprising an extended ionizing electrode spaced apart from an extended field electrode by a plurality of insulated spacers;
   (b) exciting the ionizing electrode to generate a plurality of ions, some of which flow to the insulation covered wire and penetrate through defects in the insulation; and
   (c) measuring the current which flows in the insulation covered wire from the ions as a result of the ions passing through the defects.

2. The method as described in claim 1 wherein the insulation covered wire is connected to a biasing voltage and the current is measured by a current measuring instrument.

3. The method as described in claim 1 wherein the field electrode comprises a plurality of parallel electrodes electrically connected together.

4. The method as described in claim 3 wherein the plurality of parallel electrodes are spaced around the circumference of the plurality of insulated spacers to form a grid.

5. The method as described in claim 1 wherein the ions are generated by electrically induced ionization.

6. The method as described in claim 1 wherein the ions are generated by thermally induced ionization.

7. A scanned extended ion source comprising an ionizing electrode which generates ions by field induced ionization; a plurality of ionizing burst conductors placed in a spaced apart relationship with each other and the ionizing electrode; a plurality of groups each formed by at least one capacitor in series with an ionizing gap, each group coupling one ionizing burst conductor with the ionizing electrode such that an adjacent group is coupled to a different ionizing burst conductor and wherein each ionizing burst conductor in turn is activated by a series of electrical pulses such that the ion generation propagates along the extended ion source from one ionizing gap to another.

8. The scanned ion source as described in claim 7 wherein the ionizing burst conductors are spaced in a circle around the ionizing electrode to form a coaxial extended ion source.

9. The scanned ion source as described in claim 8 wherein there are 3 ionizing burst conductors.

10. The scanned ion source as described in claim 7 wherein the ionization gaps are formed by a plurality of insulating spacers placed between the ionizing electrode and the capacitors.

11. The scanned ion source as described in claim 10 wherein the insulating spacers are disks with a plurality of apertures therein which permit ions to pass therethrough.

12. The scanned ion source as described in claim 7 wherein the electrical pulses are square waves and there is an overlap between the end of the pulses on one ionizing burst conductor and the beginning of the pulses on the next ionizing burst conductor.

13. The scanned ion source as described in claim 7 wherein the electrical pulses are square waves and there is no overlap between the end of the pulses on one ionizing burst conductor and the beginning of the pulses on the next ionizing burst conductor.

* * * * *